US011444365B2

United States Patent
Benedict et al.

(10) Patent No.: US 11,444,365 B2
(45) Date of Patent: Sep. 13, 2022

(54) RADIO-FREQUENCY (RF)-INTERFACE AND MODULAR PLATE

(71) Applicant: RAYTHEON COMPANY, Waltham, MA (US)

(72) Inventors: James Benedict, Chelmsford, MA (US); Erika Klek, Tewksbury, MA (US); John P. Haven, Lowell, MA (US); Michael Souliotis, Somerville, MA (US); Thomas V. Sikina, Harvard, MA (US); Andrew R. Southworth, Lowell, MA (US); Kevin Wilder, Derry, NH (US)

(73) Assignee: RAYTHEON COMPANY, Waltham, MA (US)

( * ) Notice: Subject to any disclaimer, the term of this patent is extended or adjusted under 35 U.S.C. 154(b) by 0 days.

(21) Appl. No.: 16/822,399

(22) Filed: Mar. 18, 2020

(65) Prior Publication Data

US 2021/0296751 A1 Sep. 23, 2021

(51) Int. Cl.
*H01P 5/08* (2006.01)
*H01P 3/08* (2006.01)

(52) U.S. Cl.
CPC ............... *H01P 5/085* (2013.01); *H01P 3/081* (2013.01)

(58) Field of Classification Search
CPC .................................. H01P 5/085; H01P 3/081
See application file for complete search history.

(56) References Cited

U.S. PATENT DOCUMENTS

| 4,657,322 | A | 4/1987 | Grellmann | |
|---|---|---|---|---|
| 5,469,130 | A | 11/1995 | Okada et al. | |
| 5,525,953 | A * | 6/1996 | Okada | H01P 1/227 333/204 |
| 5,631,446 | A | 5/1997 | Quan | |
| 5,808,529 | A | 9/1998 | Hamre | |
| 6,501,352 | B1 * | 12/2002 | Koriyama | H01L 23/66 333/260 |
| 6,639,487 | B1 * | 10/2003 | Salmela | H01P 5/028 333/238 |
| 2009/0279274 | A1 | 11/2009 | Agnew | |
| 2016/0020501 | A1 * | 1/2016 | Lindsey | B33Y 80/00 333/24 R |
| 2019/0081378 | A1 * | 3/2019 | Bates | H01L 23/552 |

OTHER PUBLICATIONS

International Search Report Application No. PCT/US2021/022742; dated Jun. 23, 2021; pp. 5.
Written Opinion Application No. PCT/US2021/022742; dated Jun. 23, 2021; pp. 10.

* cited by examiner

*Primary Examiner* — Samuel S Outten
(74) *Attorney, Agent, or Firm* — Cantor Colburn LLP

(57) ABSTRACT

A RAMP-radio frequency (RAMP-RF) assembly is provided and includes an RF panel including a microstrip interface, a plate including a stripline interface and a microstrip-to-stripline transition element operably connectable to the microstrip interface and to the stripline interface.

16 Claims, 3 Drawing Sheets

RADIO-FREQUENCY (RF)-INTERFACE AND MODULAR PLATE

BACKGROUND

The present disclosure relates to an apparatus and methods for providing board-to-board radio-frequency (RF) connections and, in particular, to an RF-interface and modular plate in which a structural plate and a thermal plate are used to make both RF and direct current (DC) connections to a printed circuit board (PCB). This enables a low profile RF Panel architecture by integrating the backplane, RF distribution, thermal and structural design into one assembly.

Beamformers and power dividers historically use a large amount of space on an array backplane, are difficult to integrate with thermal solutions and use a large amount RF connectors which drives up costs.

RF connectors are currently used to make connections between printed circuit boards (PCBs) and are traditionally precision machined from corrosion resistant materials. Because of this, RF connectors tend to be one of the largest cost drivers on RF PCBs. In addition, cable interfaces are sometimes required, which drive further costs, and RF connectors are typically installed by a solder reflow process, or manually, which leads to unnecessary processing time and assembly costs. Also, RF connectors are usually attached on the top surface or on the side of a PCB and are not low profile (they are usually taller than 3 mm), which prevents those PCBs from being stacked in a spatially efficient manner.

Currently, radar modular assemblies (RMA's) are connected together with phase matched cables to split or combine signals. This approach is robust, but uses expensive phase matched cables, realizing a design of a final system is complicated and a large amount of touch labor is often required to integrate systems together. Recently, SNAP-RF has proven that board-to-board interconnections are possible using just two different dielectric boards but, while SNAP-RF can provide for thinner than conventional beamforming systems, for example, SNAP-RF still provides for relatively thick assemblies.

SUMMARY

According to an aspect of the disclosure, a RAMP-radio frequency (RAMP-RF) assembly is provided and includes an RF panel including a microstrip interface, a plate including a stripline interface and a microstrip-to-stripline transition element operably connectable to the microstrip interface and to the stripline interface.

In accordance with additional or alternative embodiments, the RF panel is frequency independent.

In accordance with additional or alternative embodiments, the RAMP-RF assembly further includes a printed circuit board (PCB) on which the RF panel is disposed.

In accordance with additional or alternative embodiments, the plate includes at least one of a structural plate and a thermal plate.

In accordance with additional or alternative embodiments, the microstrip interface includes a ground-signal configuration and the stripline interface includes a ground-signal-ground configuration, and the microstrip-to-stripline transition element includes a ground-signal-ground configuration.

In accordance with additional or alternative embodiments, the RAMP-RF assembly further includes at least one of a chip element at the microstrip interface and additional chip elements interposed between the RF panel and the plate.

In accordance with additional or alternative embodiments, the RAMP-RF assembly further includes at least one of fastening elements coupled to the RF panel and the plate to apply a compressive force to the microstrip-to-stripline transition element and solder applied to at least a mechanical interface of the RF panel and the microstrip-to-stripline transition element.

In accordance with additional or alternative embodiments, the microstrip-to-stripline transition element is at least partially curvilinear or at least partially angular.

According to an aspect of the disclosure, a RAMP-radio frequency (RAMP-RF) assembly is provided and includes an RF panel having an upper surface and including a microstrip interface at the upper surface, a plate having a lower surface and including a stripline interface at the lower surface and a microstrip-to-stripline transition element having first and second ends and being operably connected at the first end thereof to the microstrip interface at the upper surface of the RF panel and at the second end thereof to the stripline interface at the lower surface of the plate.

In accordance with additional or alternative embodiments, the RF panel is frequency independent.

In accordance with additional or alternative embodiments, the RAMP-RF assembly further includes a printed circuit board (PCB) on which the RF panel is disposed.

In accordance with additional or alternative embodiments, the plate includes at least one of a structural plate and a thermal plate.

In accordance with additional or alternative embodiments, the microstrip interface includes a ground-signal configuration and the stripline interface includes a ground-signal-ground configuration and the microstrip-to-stripline transition element includes a ground-signal-ground configuration.

In accordance with additional or alternative embodiments, the RAMP-RF assembly further includes at least one of a chip element at the microstrip interface and additional chip elements interposed between the RF panel and the plate.

In accordance with additional or alternative embodiments, the RAMP-RF assembly further includes at least one of fastening elements coupled to the RF panel and the plate to apply a compressive force to the microstrip-to-stripline transition element and solder applied to at least a mechanical interface of the RF panel and the microstrip-to-stripline transition element.

In accordance with additional or alternative embodiments, the microstrip-to-stripline transition element is at least partially curvilinear or at least partially angular.

According to an aspect of the disclosure, a method of assembling a RAMP-radio frequency (RAMP-RF) assembly is provided and includes forming an RF panel having an upper surface to include a microstrip interface at the upper surface, forming a plate having a lower surface to include a stripline interface at the lower surface and bending a microstrip-to-stripline transition element having first and second ends into operable connection at the first end thereof to the microstrip interface at the upper surface of the RF panel and at the second end thereof to the stripline interface at the lower surface of the plate.

In accordance with additional or alternative embodiments, the microstrip interface includes a ground-signal configuration and the stripline interface includes a ground-signal-ground configuration and the microstrip-to-stripline transition element includes a ground-signal-ground configuration.

In accordance with additional or alternative embodiments, the method further includes at least one of applying a compressive force through the RF panel and the plate to the microstrip-to-stripline transition element and applying solder to at least a mechanical interface of the RF panel and the microstrip-to-stripline transition element.

In accordance with additional or alternative embodiments, the bending includes bending the microstrip-to-stripline transition element to be at least partially curvilinear or bending the microstrip-to-stripline transition element to be at least partially angular.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

For a more complete understanding of this disclosure, reference is now made to the following brief description, taken in connection with the accompanying drawings and detailed description, wherein like reference numerals represent like parts.

DETAILED DESCRIPTION

As will be described below, a RAMP-RF assembly is provided and uses PCB substrates to transmit RF signals throughout an assembly and a bent PCB or printed wiring board (PWB) to form a microstrip-to-stripline transition that interfaces between two different boards without the use of an external connector. The RAMP-RF assembly thus integrates structural, thermal, microwave, DC and logic connections all in one plate.

Figure 1:
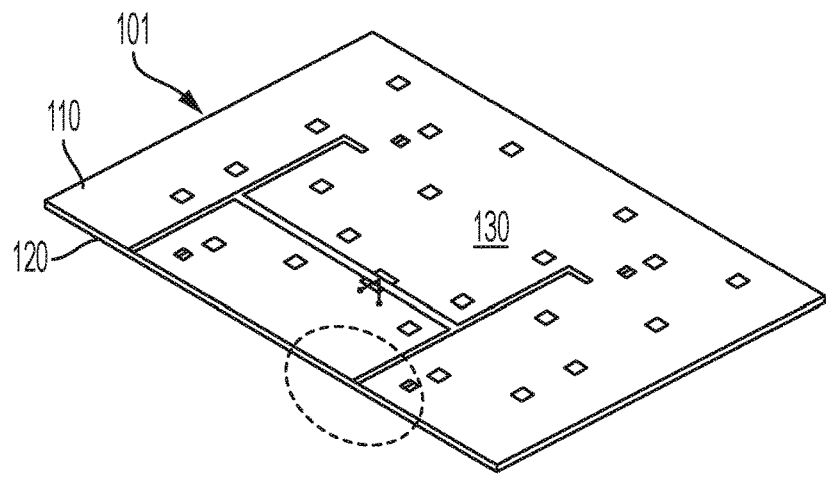
FIG. 1 is a perspective view of a component in accordance with embodiments.

With reference to FIG. 1, a component 101 is provided for use in various applications, such as a radar modular assembly (RMA) or another similar type of device. The component 101 includes multiple layers 110 and 120 and has an uppermost major surface 130 in which various electrical and electromechanical devices are disposed. These electrical and electromechanical device include, but not limited to, integrated circuits (ICs), antenna elements and faraday wall elements.

Figure 2:
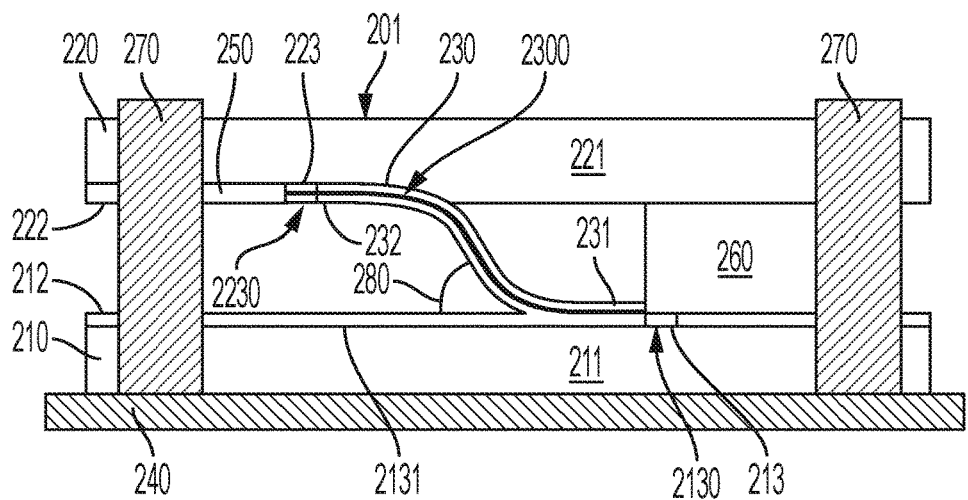
FIG. 2 is a side view of a RAMP-RF assembly of the encircled portion of the component of FIG. 1 in accordance with embodiments.
Figure 3:
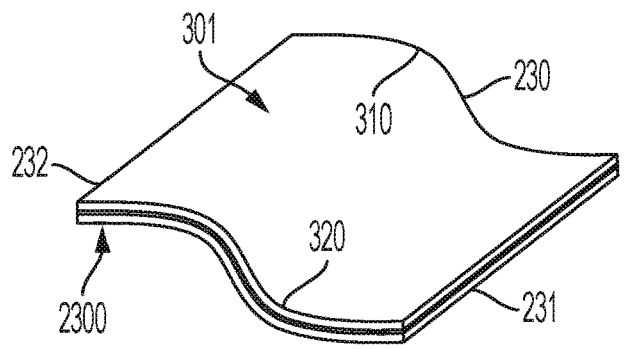
FIG. 3 is a perspective view of a microstrip-to-stripline transition element of the RAMP-RF assembly of FIG. 2 in accordance with embodiments.

With reference to FIGS. 2 and 3, a side view of the encircled portion of the component 101 of FIG. 1 is illustrated not to scale and includes a RAMP-radio frequency (RAMP-RF) assembly 201. As shown in FIGS. 2 and 3, the RAMP-RF assembly 201 includes an RF panel 210, a plate 220, a microstrip-to-stripline transition element 230 and a PCB 240 on which the RF panel 210 is disposed. The RF panel 210 exhibits frequency independence and is operable at frequencies of up to 8-12 GHz (or higher or lower). The RF panel 210 includes a body 211 having an upper surface 212 and a microstrip interface 213 at the upper surface 212. The plate 220 can be provided as at least one of a structural plate and a thermal plate and includes a body 221 having a lower surface 222 and a stripline interface 223 at the lower surface 222. The microstrip-to-stripline transition element 230 has a first longitudinal end 231 and a second longitudinal end 232 opposite the first longitudinal end 231 and is operably connectable at the first longitudinal end 231 to the microstrip interface 213 at the upper surface 212 of the RF panel 210 and at the second longitudinal end 232 to the stripline interface 223 at the lower surface 222 of the plate 220.

In accordance with embodiments, the microstrip interface 213 at the upper surface 212 of the RF panel 210 includes a ground-signal (GS) configuration 2130 and the stripline interface 223 at the lower surface 222 of the plate 220 includes a ground-signal-ground (GSG) configuration 2230. The GS configuration 2130 is characterized in that a ground conductor and a signal conductor are provided on opposite sides of dielectric material, which insulates the signal conductor from the ground conductor. In accordance with further embodiments, the ground conductor of the GS configuration 2130 can extend along the upper surface 212 of the RF panel 210 as a trace 2131. The GSG configuration 2230 is characterized in that dielectric material is provided on opposite sides of a signal conductor and that the signal conductor and the dielectric material are interposed between ground conductors such that the dielectric material insulates the signal conductor from the ground conductors. The microstrip-to-stripline transition element 230 can include a GSG configuration 2300 similar to the GSG configuration 2230 of the stripline interface 223. As such, the upper ground conductor of the GSG configuration 2300 of the microstrip-to-stripline transition element 230 terminates at the microstrip interface 213.

With continued reference to FIG. 2, the RAMP-RF assembly 201 can further include at least one of a chip element 250 at the microstrip interface 213, one or more additional chip elements 260 interposed between the RF panel 210 and the plate 220, fastening elements 270 and solder 280. The chip element 250 can be disposed in signal communication with the second longitudinal end 232 of the microstrip-to-stripline transition element 230 and the one or more additional chip elements 260 can be disposed in signal communication with the first longitudinal end 231 of the microstrip-to-stripline transition element 230 (i.e., with the terminus of the upper ground conductor of the GSG configuration 2300 of the microstrip-to-stripline transition element 230). The fastening elements 270 can be coupled to the RF panel 210 and the plate 220 to apply a compressive force between the RF panel 210 and the plate 220 and onto the microstrip-to-stripline transition element 230 in order to reduce a total height of the RAMP-RF assembly 201 (e.g., a distance between the upper surface 212 of the RF panel 210 and the lower surface 222 of the plate 220 may be about ~1.1 mm and a total height of the microstrip-to-stripline transition element 230 may be about ~2 mm or about ~1.5-~2 mm) and to increase a reliability between the connections of the microstrip-to-stripline transition element 230 to the microstrip interface 213 and to the stripline interface 223. The solder 280 can be applied to multiple locations of the RAMP-RF assembly 201 including, but not limited to, at least a mechanical interface of the RF panel 210 and the microstrip-to-stripline transition element 230, in order to provide and increase support for the microstrip-to-stripline transition element 230.

Figure 4:
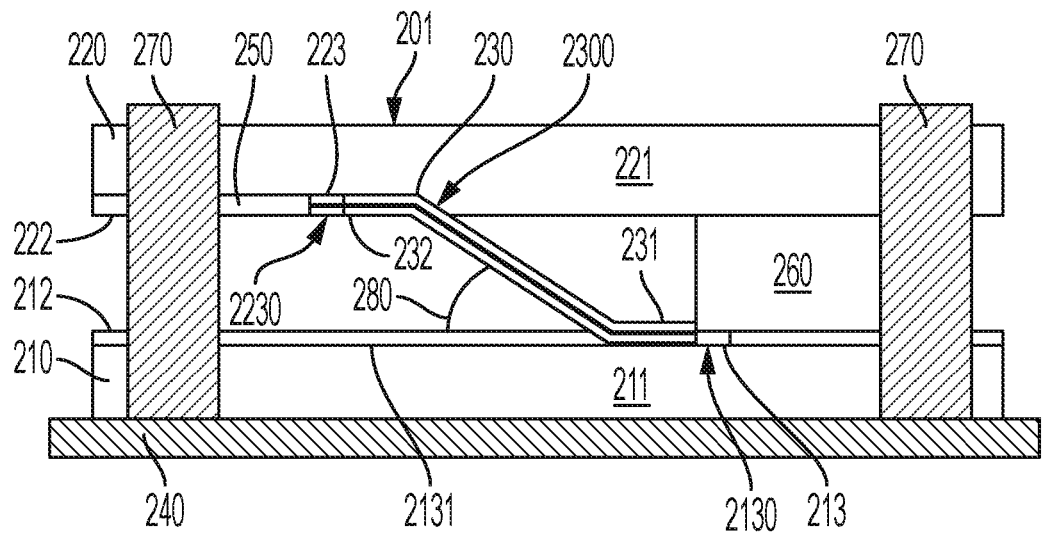
FIG. 4 is a side view of a RAMP-RF assembly of the encircled portion of the component of FIG. 1 in accordance with alternative embodiments.
Figure 5:
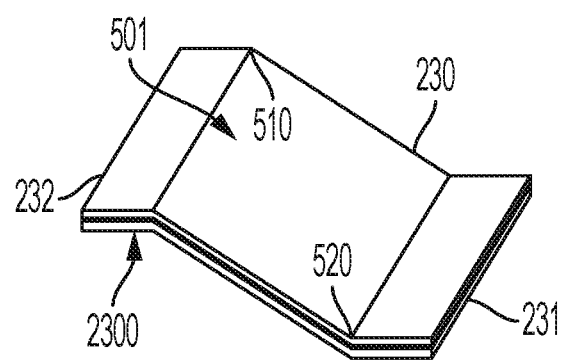
FIG. 5 is a perspective view of a microstrip-to-stripline transition element of the RAMP-RF assembly of FIG. 4 in accordance with alternative embodiments.

With continued reference to FIGS. 2 and 3 and with additional reference to FIGS. 4 and 5, which illustrate the RAMP-RF assembly 201 in accordance with alternative embodiments that are generally similar to those of FIGS. 2 and 3, the microstrip-to-stripline transition element 230 can be at least partially curvilinear 301 as shown in FIGS. 2 and 3 or at least partially angular 501 as shown in FIGS. 4 and 5. That is, where the curvilinear embodiments of the microstrip-to-stripline transition element 230 of FIGS. 2 and 3 can have first and second curved or rounded inflexion points 310 and 320, the angular embodiments of the microstrip-to-stripline transition element 230 of FIGS. 4 and 5 can have first and second angular inflexion points 510 and 520.

Figure 6:
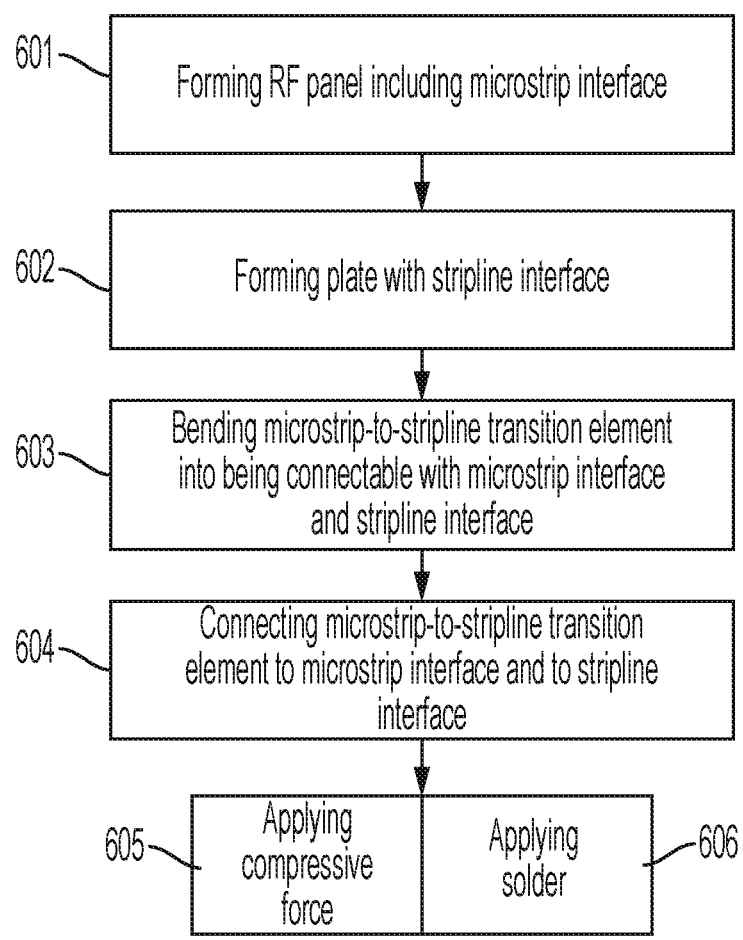
FIG. 6 is a flow diagram illustrating a method of assembling a RAMP-RF assembly in accordance with embodiments.

With reference to FIG. 6, a method of assembling the RAMP-RF assembly 201 as described above is provided. As shown in FIG. 6, the method includes forming the RF panel 210 having the upper surface 212 to include the microstrip interface 213 at the upper surface 212 (601) and forming the plate 220 having the lower surface 222 to include the stripline interface 223 at the lower surface 222 (601). The method further includes bending the microstrip-to-stripline transition element 230 having the first and second longitudinal ends 231 and 232 into a condition of being operably connectable at the first longitudinal end 231 to the microstrip interface 213 at the upper surface 212 of the RF panel 210 and at the second longitudinal end 232 to the stripline interface 223 at the lower surface 222 of the plate 220 (603). In addition, the method can include connecting the first and second longitudinal ends 231 and 232 of the microstrip-to-stripline transition element 230 to the microstrip interface 213 and to the stripline interface 223, respectively (604).

In accordance with embodiments, the bending of operation 603 can include bending the microstrip-to-stripline transition element 230 to be at least partially curvilinear (see FIGS. 2 and 3) or bending the microstrip-to-stripline transition element 230 to be at least partially angular (see FIGS. 4 and 5). In accordance with further embodiments, the method can include at least one of applying a compressive force through the RF panel 210 and the plate 220 to the microstrip-to-stripline transition element 230 by way of the fastening elements 270 (605) and applying the solder 280 to at least a mechanical interface of the RF panel 210 and the microstrip-to-stripline transition element 230 (606).

Technical effects and benefits of the present invention are the provision of a RAMP-RF assembly that uses structural and thermal plates to make both RF and DC connections to a PCB board. The approach eliminates phase matched cables, allows the entire array to reach a lower profile, integrates thermal, structural and distribution layers together into one assembly, integrates Faraday Walls into a plate to control mode propagation, increases the area available for thermal distribution and provides for a simple stripline-to-microstrip transition with pressure contact made with fasteners.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

While the preferred embodiments to the invention have been described, it will be understood that those skilled in the art, both now and in the future, may make various improvements and enhancements which fall within the scope of the claims which follow. These claims should be construed to maintain the proper protection for the invention first described.

What is claimed is:

1. A radio frequency (RF) assembly, comprising:
an RF panel comprising a microstrip interface, the microstrip interface comprising a ground-signal configuration;
a plate comprising a stripline interface, the stripline interface comprising a ground-signal-ground configuration;
a microstrip-to-stripline transition element, which comprises a ground-signal-ground configuration that is curvilinear, operably connectable to the microstrip interface and to the stripline interface; and
an additional chip element interposed between an upper surface of the RF panel and a lower surface of the plate, wherein:
the microstrip and stripline interfaces are axially offset from one another with the microstrip-to-stripline transition element having an inflective curve between the microstrip and stripline interfaces,
an upper ground conductor of the ground-signal-ground configuration of the microstrip-to-stripline transition element terminates at a side of the additional chip element facing the inflective curve, and
the ground-signal configuration of the microstrip interface extends between the additional chip element and the RF panel.

2. The RF assembly according to claim 1, wherein:
the ground-signal configuration of the microstrip interface is characterized in that dielectric material insulates a signal conductor from a ground conductor and the ground conductor extends along an upper surface of the RF panel,
the ground-signal-ground configuration of the stripline interface is characterized in that dielectric material insulates a signal conductor from ground conductors along a lower surface of the plate, and
the ground-signal-ground configuration of the microstrip-to-stripline transition element is similar to that of the stripline interface with the upper ground conductor terminating at the microstrip interface.

3. The RF assembly according to claim 2, wherein:
the stripline interface is longitudinally interposed between a longitudinal end of the microstrip-to-stripline transition element and a chip element at the lower surface of the plate.

4. The RF assembly according to claim 1, further comprising a printed circuit board (PCB) on which the RF panel is disposed.

5. The RF assembly according to claim 1, wherein the plate comprises at least one of a structural plate and a thermal plate.

6. The RF assembly according to claim 1, further comprising at least one of a chip element at the stripline interface and additional chip elements interposed between the RF panel and the plate.

7. The RF assembly according to claim 1, further comprising at least one of:
fastening elements coupled to the RF panel and the plate to apply a compressive force to the microstrip-to-stripline transition element; and
solder applied to at least a mechanical interface of the RF panel and the microstrip-to-stripline transition element.

8. A radio frequency (RF) assembly, comprising:
an RF panel having an upper surface and comprising a microstrip interface at the upper surface;
a plate having a lower surface and comprising a stripline interface at the lower surface;
a microstrip-to-stripline transition element, which has a ground-signal-ground configuration which is curvilinear, having first and second ends and being operably connected at the first end thereof to the microstrip interface at the upper surface of the RF panel and at the second end thereof to the stripline interface at the lower surface of the plate; and
an additional chip element interposed between the upper surface of the RF panel and the lower surface of the plate,
wherein:
the microstrip and stripline interfaces are axially offset from one another with the microstrip-to-stripline transition element having an inflective curve between the microstrip and stripline interfaces,
an upper ground conductor of the ground-signal-ground configuration of the microstrip-to-stripline transition element terminates at a side of the additional chip element facing the inflective curve, and
the ground-signal configuration of the microstrip interface extends between the additional chip element and the RF panel.

9. The RF assembly according to claim 8, wherein:
the ground-signal configuration of the microstrip interface is characterized in that dielectric material insulates a signal conductor from a ground conductor and the ground conductor extends along the upper surface of the RF panel,
the ground-signal-ground configuration of the stripline interface is characterized in that dielectric material insulates a signal conductor from ground conductors along the lower surface of the plate, and
the ground-signal-ground configuration of the microstrip-to-stripline transition element is similar to that of the stripline interface with the upper ground conductor terminating at the microstrip interface.

10. The RF assembly according to claim 9, wherein:
the stripline interface is longitudinally interposed between a longitudinal end of the microstrip-to-stripline transition element and a chip element at the lower surface of the plate.

11. The RF assembly according to claim 8, further comprising a printed circuit board (PCB) on which the RF panel is disposed.

12. The RF assembly according to claim 8, wherein the plate comprises at least one of a structural plate and a thermal plate.

13. The RF assembly according to claim 8, further comprising at least one of a chip element at the microstrip interface and additional chip elements interposed between the RF panel and the plate.

14. The RF assembly according to claim 8, further comprising at least one of:
fastening elements coupled to the RF panel and the plate to apply a compressive force to the microstrip-to-stripline transition element; and
solder applied to at least a mechanical interface of the RF panel and the microstrip-to-stripline transition element.

15. A radio frequency (RF) assembly, comprising:
an RF panel having an upper surface and comprising a microstrip interface at the upper surface;
a plate having a lower surface and comprising a stripline interface at the lower surface; and
a microstrip-to-stripline transition element comprising:
a first end operably connected to the microstrip interface at the upper surface of the RF panel;
a second end operably connected to the stripline interface at the lower surface of the plate;
a section which has a ground-signal-ground configuration that is curvilinear and which is connected to the first and second ends; and
an additional chip element interposed between the upper surface of the RF panel and the lower surface of the plate,
wherein:
the microstrip and stripline interfaces are axially offset from one another with the microstrip-to-stripline transition element having an inflective curve between the microstrip and stripline interfaces,
an upper ground conductor of the ground-signal-ground configuration of the microstrip-to-stripline transition element terminates at a side of the additional chip element facing the inflective curve, and
a ground-signal configuration of the microstrip interface extends between the additional chip element and the RF panel.

16. The radio frequency (RF) assembly according to claim 15, wherein the curvilinear section curves downwardly from the first end and upwardly to the second end.

* * * * *